US012635108B2

(12) United States Patent
Liang

(10) Patent No.: US 12,635,108 B2
(45) Date of Patent: May 19, 2026

(54) FAN CONTROL SYSTEM AND METHOD

(71) Applicant: ASIA VITAL COMPONENTS (CHINA) CO., LTD., Shenzhen (CN)

(72) Inventor: Liqiu Liang, Shenzhen (CN)

(73) Assignee: ASIA VITAL COMPONENTS (CHINA) CO., LTD., Shenzhen (CN)

( * ) Notice: Subject to any disclaimer, the term of this patent is extended or adjusted under 35 U.S.C. 154(b) by 0 days.

(21) Appl. No.: 18/894,601

(22) Filed: Sep. 24, 2024

(65) Prior Publication Data

US 2026/0052643 A1 Feb. 19, 2026

(30) Foreign Application Priority Data

Aug. 15, 2024 (TW) ................................. 113130721

(51) Int. Cl.
*H05K 7/20* (2006.01)
*F04D 27/00* (2006.01)
(52) U.S. Cl.
CPC ....... *H05K 7/20209* (2013.01); *F04D 27/004* (2013.01)
(58) Field of Classification Search
CPC ......................... H05K 7/20209; F04D 27/004
See application file for complete search history.

(56) References Cited

U.S. PATENT DOCUMENTS

2005/0013114 A1* 1/2005 Ha ........................... G06F 1/206
361/679.48
2011/0295442 A1* 12/2011 Bekker ................. F04D 27/004
700/90
2018/0341297 A1* 11/2018 Kinstle, III ........ H05K 7/20172
2019/0353170 A1* 11/2019 Lin .......................... F04D 25/06

FOREIGN PATENT DOCUMENTS

CN 117231540 A 12/2023

OTHER PUBLICATIONS

Search Report dated Apr. 17, 2025 issued by Taiwan Intellectual Property Office for counterpart application No. 113103721.

* cited by examiner

*Primary Examiner* — Aaron R Eastman
(74) *Attorney, Agent, or Firm* — Demian K. Jackson; Jackson IPG PLLC

(57) ABSTRACT

In a fan control system and method, fans start operating according to a default value, and it is detected whether there are PWM signals input to the fan control system; if not, the fans keep operating according to the default value; or if yes, it is detected whether there is any change in the input PWM signals; if not, the fans keep operating according to presently set values; or if yes, the fan control system computes to derive a system PWM value, based on which internal PWM values are set for the fans to cycle within corresponding intervals. The technique of spread spectrum (SS) of rotational speed is used to reduce resonance energy concentration and amplitude, and accordingly reduce noise. And, an average rotational speed of the fan can be set as a target value, enabling the whole computer system to have consistent heat dissipation without causing unstable operation.

14 Claims, 8 Drawing Sheets

FAN CONTROL SYSTEM AND METHOD

This application claims the priority benefit of Taiwan patent application number 113130721 filed on Aug. 15, 2024, the disclosure of which is hereby incorporated by reference in its entirety.

FIELD OF THE INVENTION

The present invention relates to a fan control system and method, and more particularly, to a fan control system and method applied to cooling fans working in a computer system. The fan control system and method of the present invention employ the rotational speed (revolutions-per-minute, RPM) spread spectrum technique to prevent concentration of resonance energy, reduce the amplitude of the resonance, and accordingly, reduce the noise of the fan, and the fan can set an average RPM to be a target value.

BACKGROUND OF THE INVENTION

Generally, computers can be classified into personal computers, servers, supercomputers, and artificial intelligence (AI) servers according to their applications and computing performance. Among others, personal computers usually include one or two processors and are mainly used to handle daily administrative affairs and provide related multimedia recreational functions. For some operations that require relatively complicate computation, such as three-dimensional computer-aided drawing, a server is needed. Further, in response to the requirement of network applications, businesses and industries in most fields prefer to use servers equipped with two to four processors. For the applications in some special conditions, it is also preferred to use a server system having eight to sixteen processors. In some application fields for specific usages that require super high computing performance, such as nuclear bomb simulation, weather and climate monitoring, and gene engineering, supercomputers formed by decades or even hundreds and thousands of serially connected processors or secondary computer systems are usually required. Further, in terms of the currently available AI technology, it is necessary to use an AI server including a plurality of chip sets, for example, the AI chip sets supplied by Nvidia.

Presently, AI servers and AI data centers are generally used in data collection and computation with algorithm. Due to the need in computing and processing a huge amount of data, it is necessary to provide chips/chip sets with even higher computing performance. However, the problem of energy consumption and heat production come along with the upgraded computing and processing performance.

Presently, the central processing unit (CPU) chips, AI chips, and/or AI chip sets internally contain more than one hundred millions of transistors, which produce extremely high amount of heat during operation thereof. The high amount of heat so produced, if not removed timely in a proper manner, would be accumulated in the computer system to result in an overheated system environment temperature, which in turn results in lowered system stability and even abnormal conditions, such as crash of computer system.

In the prior art, the produced heat is dissipated by mounting a plurality of cooling fans in the computers, such as personal computers, servers, supercomputers and AI servers, to form convection of heat. Since the cooling fans can effectively reduce the internal system temperature and have low manufacturing cost, they are widely adopted for computer heat dissipation.

To prevent the system from unstable operating state, many electronic products, such as computers and home appliances, often use hysteresis to avoid the occurrence of resonance. In this case, some sections of rotational speeds (RPM) are skipped in the process of operation without operating at these rotational speeds. By doing this, it is able to avoid the unstable operating state of the system.

Further, sometimes, when the fan mounted in the electronic product operates at a certain rotational speed would resonate with the product system. In this case, the fan should be adjusted before it is mounted in the product system and the noise spectrum is tested. However, the adjustment of the fan would lead to delay of the time for designing the fan product. In some worse condition, it might even lead to losing of the customer's order.

In the currently available prior art, such as the computer system with multi-node server chassis, the chassis includes a series of nodes, each of which has a main printed circuit board (PCB), which is supported by a slidable component, such as a processor, a storage device, a network interface card, and other similar components. The nodes respectively have a corresponding board management controller (BMC) coupled to an inter-integrated circuit (I2C) bus. The chassis also includes a chassis management controller (CMC) for receiving via the I2C bus the fan control instructions from the board management controllers. The chassis further includes a fan heat dissipation plate containing complex programmable logic device (CPLD) for sending command signal to the fans in the chassis. The complex programmable logic device is also coupled with the I2C bus to receive the fan speed instruction from the chassis management controller. The complex programmable logic device controls the fan speeds of a series of fans. The fan is controlled by regulating the frequency of a pulse width modulation (PWM) signal generated by the complex programmable logic device. The fan sends a speed signal to the complex programmable logic device, which in turn reflects a practical speed of the fan in the unit of revolutions per minute (RPM). The chassis management controller monitors the practical speed of the fans according to the RPM data received from the complex programmable logic device. Each of the board management controllers provides the PWM value to the chassis management controller based on the node to be cooled. The above described prior art has the problem of thermal inefficiency. This is because that, when responding to one of the board management controllers that requests for a higher fan speed, only some of the fans can provide a higher cooling level, while all other fans keep operating at a lower rotational speed. Since only the PWM command from one of the board management controllers is responded, the complex programmable logic device changes only some of the fans.

One prior art discloses a fan controller and a computer system, according to which a fan controller based on hardware is used to control a fan module in a computer system having a plurality of computer nodes, which respectively include a server processor; the fan controller also includes a slave module for receiving fan speed commands from the server processors, and a fan speed generator is coupled to the slave module and a subset of fan modules; the fan speed generator receives the fan speed commands from the slave module and the fan speed output from the subset of fan modules; and the fan speed generator is configured to output the fan speed commands to every fan module in the subset.

Another prior art discloses a fan rotational speed synchronizing method applied to a first fan and a second fan that are connected end to end. The method includes the following steps: using a first Hall sensor to sense a pulse width generated by the rotational speed of the first fan, and converting the pulse width generated by the first fan's rotational speed into a first pulse signal for transmitting to a microprocessor; and using a second Hall sensor to sense a pulse width generated by the rotational speed of the second fan, and converting the pulse width generated by the second fan's rotational speed into a second pulse signal for transmitting to the microprocessor; the microprocessor comparing the first pulse signal and second pulse signal that are corresponding to the pulse width of the first fan's rotational speed and the second fan's rotational speed, respectively; the microprocessor generating a PWM signal according to a difference between the size of the first and the second pulse signal and sending the PWM signal to the second fan; and the microprocessor using the PWM signal to control the second fan's rotational speed to be the same as the first fan's rotational speed, so as to effectively control the fans to have synchronized rotational speed and achieve the effect of reducing noise produced by the fans in operating.

The other prior art discloses a fan control system including a plurality of fans and a control unit. The control unit includes a controller and a memory for storing first fan starting data containing a plurality of first starting time points and a plurality of first starting input values; based on the first starting time points, the controller controls a plurality of output pins sequentially to output a plurality of output signals corresponding to the first starting input values.

Each of the fans is provided with a fan controller and a fan memory for storing second fan starting data the same as the first fan starting data; the fan controller uses the second starting time points of the second fan starting data that match the output signals as a basis to output a driving signal corresponding to every second starting input values to control and start the fans.

In conclusion, the prior art fan control systems have tried to (a) avoid heat from accumulating in the computer to result in overheated system environment and low system stability or even system abnormality; (b) avoid system unstable conditions by using hysteresis phenomenon in the electronic products, such as computers and home appliances, to avoid resonance sound, so as to skip some sections of rotational speeds without operating at all at these rotational speeds; and (c) avoid the noise, which is produced by the fan mounted in the electronic products when it operates at a certain rotational speed to cause resonance with the system, by regulating the fan before it is mounted in the system and then testing the system to check the noise spectrum thereof. However, the above ways would disadvantageously lead to delay in fan product designing time or even losing of the customer's order. Therefore, it is desirable to work out an improved fan control system and method to overcome the above problems.

SUMMARY OF THE INVENTION

A primary object of the present invention is to provide a fan control system and method applied to cooling fans working in a computer system. When the fan control system is implemented in the fan control method, one or more fans in the fan control system start operating according to a default value and are detected whether there are two or more PWM signals being input thereto. If not, the fans keep operating according to the default value; and if yes, further detection is conducted to verify whether there is any change in the input PWM signals. If not, the fans keep operating according to presently set values; and if yes, the fan control system computes to derive a system PWM value, based on which internal PWM values are set for the fans to cycle within corresponding intervals. The fan control system and method of the present invention employ the technique of spread spectrum (SS) of rotational speed to avoid concentration of resonance energy and reduce the amplitude of the resonance energy and accordingly, reduce the noise produced by the fans during operation. By using the SS technique, the fans can have an average rotational speed (revolutions per minute, RPM) being a preset target value, so that consistent heat dissipation effect can be achieved on the whole computer system without causing unstable system heat dissipation.

Another object of the present invention is to provide a fan control system and method applied to cooling fans working in a computer system or other electronic products to solve the problem of noise produced by a fan due to resonance occurred between the fan of a certain rotational speed and the system. In this case, what can be done is to try to adjust the fan mechanism and then test the noise spectrum in the system. In the present invention, the resolution of noise is the use of spread spectrum (SS) of the rotational speed to prevent the resonance energy from concentrating and reduce the amplitude of resonance energy and accordingly, reduce the noise. By using the SS technique, the fan can have an average rotational speed being a preset target value; so that consistent heat dissipation effect can achieved on the whole computer system without causing unstable system heat dissipation.

A further object of the present invention is to provide a fan control system and method applied to cooling fans working in a computer system or other electronic products to solve the problem of unstable system state. Some of the electronic products, such as computers and home appliances, employ hysteresis to avoid a resonant sound. This would cause the fan operation to skip some rotational speed section, i.e. the fan does not operate at all at some rotational speeds, so that the system can avoid the occurrence of unstable operational state. However, in the present invention, there is an average RPM value for the fan operational speed. Therefore, there would not be any oscillation that could not find a steady-state point.

To achieve the above and other objects, the fan control system provided according to the present invention is applied to cooling fans working in a computer system. The fan control system includes one or more fans, each of which includes a cooling fan controller and a fan data memory. Depending on actual implementation and requirements, the fan control system may further include a control unit module having a controller and a memory. However, for the fan control system of the present invention, the control unit module is not a prerequisite but can be deemed as a peripheral provided for cooperative operation with the fan control system.

The fans of the fan control system respectively include a cooling fan controller and a fan data memory.

After the fans of the fan control system have started operating according to a default value, the cooling fan controllers detect whether there are two or more PWM signals being input to the fans. If not, the fans containing the cooling fan controllers keep operating according to the default value; or if yes, the cooling fan controllers further detect whether there is any change in the two or more PWM signals input to the fan control system. If not, the fans containing the cooling fan controllers keep operating according to presently set values; or if yes, the fan control system computes and derives a system PWM value, based on which the cooling fan controllers set internal PWM values for the fans to cycle within corresponding intervals.

The cooling fan controllers compute on the two or more input PWM signals to derive an optimal system PWM value, based on which the cooling fan controllers set the internal PWM values for the fans to cycle within corresponding intervals. In addition to the computing on the two or more input PWM signals to derive the optimal system PWM value, the cooling fan controllers further compute values of revolutions per minute (RPM), to which the input two or more PWM signals correspond. The cooling fan controllers can also set one or more sections of RPM intervals for the purpose of RPM spread spectrum (SS). For example, the first section is the interval of PWM1~PWM2, and/or the second section is the interval of PWM3~PWM4, and/or the third section is the interval of PWM1 and PWM3. The cooling fan controllers may also set a rotational speed difference ΔRPM for SS, set the number of SS, and set the time at which the RPM changes.

The fan data memory is used to store temporarily/store the two or more PWM signals and/or the system PWM value and/or the more than two RPM values and/or the ΔRPM for RPM SS and/or the number of SS and/or the time at which the RPM changes.

When the fan control method of the present invention is used to implement the above fan control system, the one or more fans of the fan control system first start operating according to a default value. Then, a detection step is conducted to detect whether there are two or more PWM signals being input to the fan control system. If not, the fans of the fan control system keep operating according to the default value.

If it is detected there are two or more PWM signals being input to the fan control system, a PWM signal detection step is conducted to detect whether there is any change in the two or more input PWM signals. If not, the fans of the fan control system keep operating according to presently set values.

Or, if it is detected there is any change in the input two or more PWM signals, a value setting step is conducted. In the value setting step, a system PWM value computed by the fan control system is used as a basis to set internal PWM values for the fans to cycle within corresponding intervals.

In the value setting step, the cooling fan controllers compute on the two or more input PWM signals to derive an optimal system PWM value, based on which the cooling fan controllers set the internal PWM values for the fans to cycle within corresponding intervals. In addition to the computing on the two or more input PWM signals to derive the optimal system PWM value, the cooling fan controllers further compute values of revolutions per minute (RPM), to which the input two or more PWM signals correspond. The cooling fan controllers can set one or more sections of RPM intervals for the purpose of RPM spread spectrum (SS). For example, the first section is the interval of PWM1~PWM2, and/or the second section is the interval of PWM3~PWM4, and/or the third section is the interval of PWM1 and PWM3. The cooling fan controllers may also set a rotational speed difference ΔRPM for SS, set the number of SS, and set the time at which the RPM changes.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

The above mentioned objects and structural and functional features of the present invention will now be described with some preferred embodiments along with the accompanying drawings. However, it is understood the accompanying drawings are only illustrated for reference and not intended to limit the present invention in any way.

Figure 1:
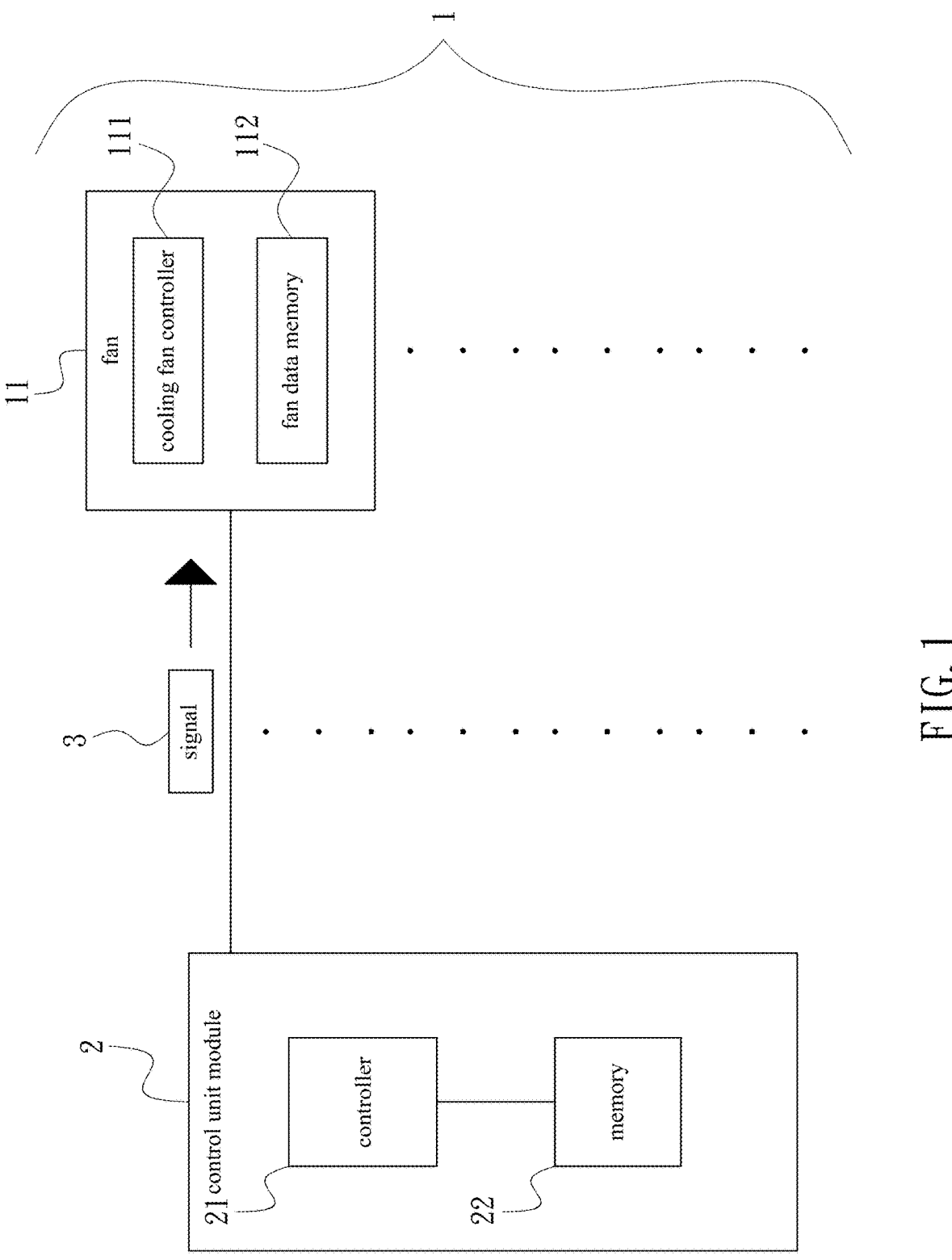
FIG. 1 is a block diagram showing the framework and the operation of a fan control system according to a preferred embodiment of the present invention.

FIG. 1 is a block diagram showing a framework and operation of a fan control system according to a preferred embodiment of the present invention.

As shown in FIG. 1, the fan control system of the present invention is generally denoted by reference numeral 1 and includes more than one fan 11. Each of the fans 11 includes a cooling fan controller 111 and a fan data memory 112. Depending on practical implementation and requirement, the fan control system 1 can further include a control unit module 2 consisting of a controller 21 and a memory 22. However, for the fan control system 1 of the present invention, the control unit module 2 is not a prerequisite but a peripheral provided for cooperative operation with the fan control system 1.

When the fans 11 of the fan control system 1 start operating according to a default value, the cooling fan controllers 111 detect whether there are two or more PWM signals 3 being input. If not, the fans 11 including the cooling fan controllers 111 keep operating according to the default value; or, if yes, the cooling fan controllers 111 further detect whether there is any change in the two or more PWM signals 3 input to the fan control system 1. If not, the fans 11 including the cooling fan controllers 111 keep operating according to presently set values; or, if yes, the cooling fan controllers 111 shall follow a system PWM value computed and derived by the fan control system 1 to set internal PWM values for the fans 11 to cycle within corresponding intervals.

The cooling fan controllers 111 compute on signals 3 of the two or more input PWM signals to derive an optimal system PWM value and set the internal PWM values for the fans 11 to cycle within the corresponding time intervals. In addition to the calculation of the optimal system PWM value based on the signals 3 of the input two or more PWM signals, the cooling fan controllers 111 also compute values of revolutions per minute (RPM), to which the input PWM signals correspond. The cooling fan controllers 111 may set one or more sections of RPM intervals for the purpose of RPM spread spectrum (SS). For example, the first section is the interval of PWM1~PWM2, and/or the second section is the interval of PWM3~PWM4, and/or the third section is the interval of PWM1 and PWM3, and/or the fourth section is the interval of PWM1~PWM2~PWM3. The cooling fan controllers 111 may also set a difference in RPM (ΔRPM) for the spread spectrum, the number of spread spectrum, or the time at which the rotational speed (RPM) changes.

The fan data memory 112 can store temporarily/store signals 3 of the two or more PWM signals, and/or the system PWM values, and/or two or more PWM values, and/or the ΔRPM for spread spectrum, and/or the number of spread spectrums, and/or the time at which the rotational speed (RPM) changes.

The fan data memory 112 may be at least one of a flash random access memory (RAM), a hard disk drive (HDD), a solid state disk (SSD), a universal serial bus (USB) flash drive, and other units allowing for data access.

The fan control system 1 with a control unit module 2 is applied to an electronic apparatus, such as a computer, a server, a supercomputer, an artificial intelligence (AI) server, a communication chassis, or other electronic devices. The control unit module 2 includes a controller 21 and a memory 22. The controller 21 may be, but not limited to, a microcontroller (MCU). The controller 21 has more than one output pin and a main power pin for receiving an input voltage $V_c$ (such as 12V or 10V). The output pins are correspondingly electrically connected to the fans 11 of the fan control system 1 and are represented as PWM signal output pins for outputting PWM signals (i.e. output signals) to the corresponding fans 11 of the fan control system 1.

In other words, the output pins of the controller 21 can output signals 3 of the two or more PWM signals to the corresponding fans 11 of the fan control system 1.

In practical implementation of the present invention, in addition to the output pins, the controller 21 further includes other pins for executing other controls.

The controller 21 may be a processor or a digital signal processor. The above mentioned output pins are voltage output pins or serial data output pins, or other specific pins, such as I/O pins, for outputting signals (such as voltage signals or serial data signals) to the fan control system 1 for controlling and starting corresponding fans and/or PWM signals (i.e. output signals).

The memory 22 can be a random access memory (RAM), a flash RAM, a hard disk drive (HDD), a solid state disk (SSD), or a USB flash drive, or other units allowing for data access. The memory 22 is electrically connected to the controller 21 and is used to store starting values/starting data, such as input voltage 12V or 10V, of the fans 11 of the fan control system 1.

Figure 2:
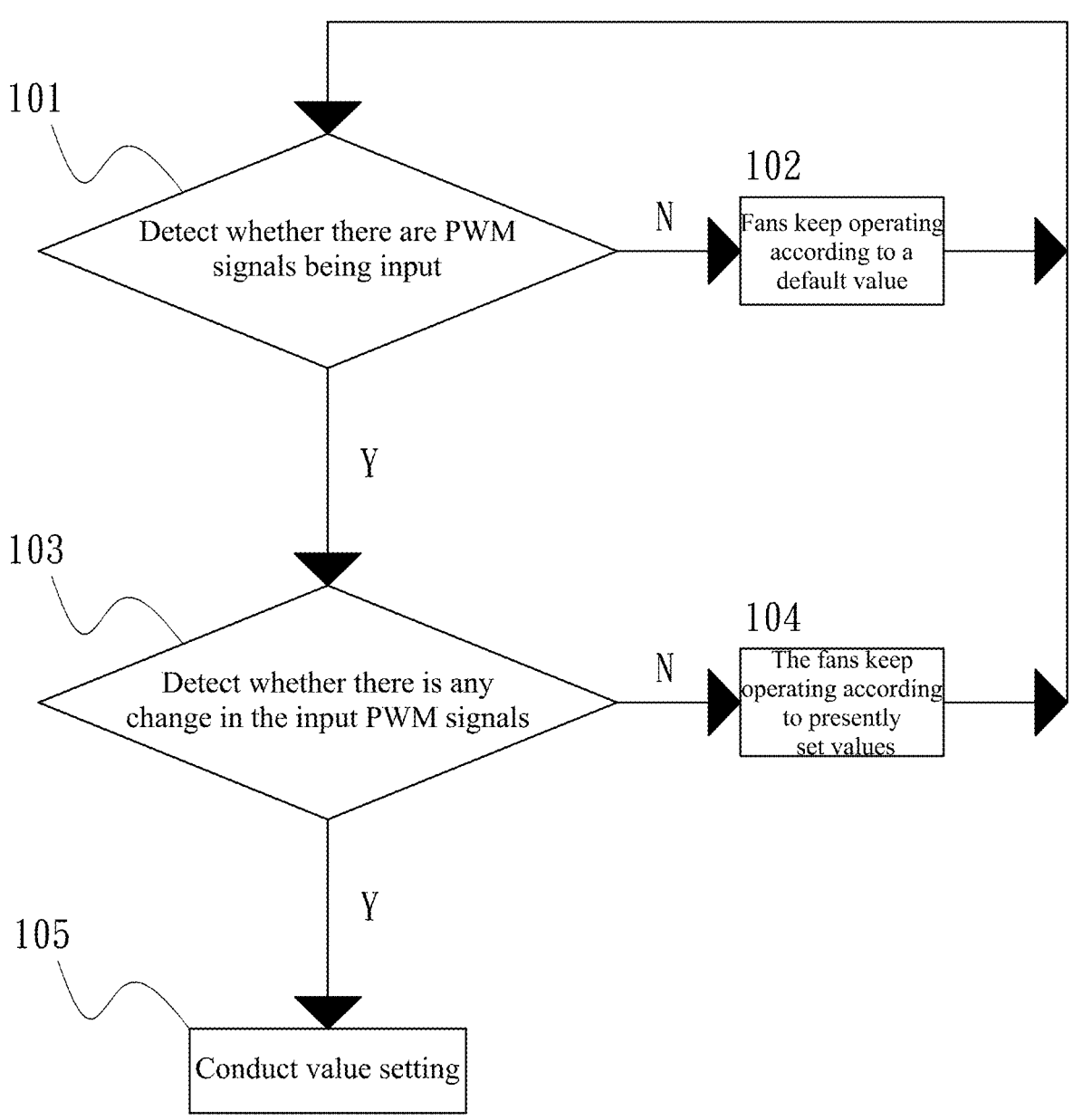
FIG. 2 is a flowchart showing the steps included in a fan control method according to a first embodiment of the present invention for implementing the fan control system of FIG. 1.

FIG. 2 is a flowchart showing the steps included in a fan control method according to a first embodiment of the present invention for implementing the fan control system 1 of FIG. 1.

As shown in FIG. 2, in a first step 101 of the fan control method of the present invention, detection is conducted when the fans 11 of the fan control system 1 have started operation according to a default value. The cooling fan controllers 111 of the fans 11 detect the fan control system 1 whether there are two or more PWM signals 3 being input. If not, the fan control method goes to a second step 102. Or, if yes, the fan control method goes to a third step 103.

In the second step 102, the fan 11 of the fan control system 1 including the cooling fan controllers 111 keep operating according to the default value; and the fan control method goes back to the first step 101.

On the other hand, in the third step 103, the detection of PWM signals is conducted. The cooling fan controllers 111 of the fans 11 detect whether there is any change in the input two or more PWM signals 3. If not, the fan control method goes to a fourth step 104. Or, if yes, the fan control method goes to a fifth step 105.

In the fourth step 104, the fans 11 of the fan control system 1 keep operating according to presently set values and the fan control method goes back to the first step 101.

On the other hand, in the fifth step 105, value setting is conducted. The fan control system 1 computes and derives a system PWM value, based on which the cooling fan controllers 111 set internal PWM values for the fans 11 to cycle within corresponding intervals.

Here, the cooling fan controllers 111 calculate on signals 3 of the input two or more PWM signals to derive the optimal system PWM value for setting the internal PWM values of the fans 11 to cycle in the corresponding intervals. In addition to the calculation of the optimal system PWM value based on the signals 3 of the input two or more PWM signals, the cooling fan controllers 111 also compute the values of revolutions per minute (RPM), to which the two or more input PWM signals 3 correspond, for the purpose of spread spectrum (SS) of rotational speed. The cooling fan controllers 111 may set one or more sections of RPM intervals. For example, the first section is the interval of PWM1~PWM2, the second section is the interval of PWM3~PWM4, the third section is the interval of PWM1 and PWM3, and the fourth section is the interval of PWM1~PWM2~PWM3. The cooling fan controllers 111 may also set the ΔRPM for SS, the number of SS, or the time at which the rotational speed changes.

Figure 3:
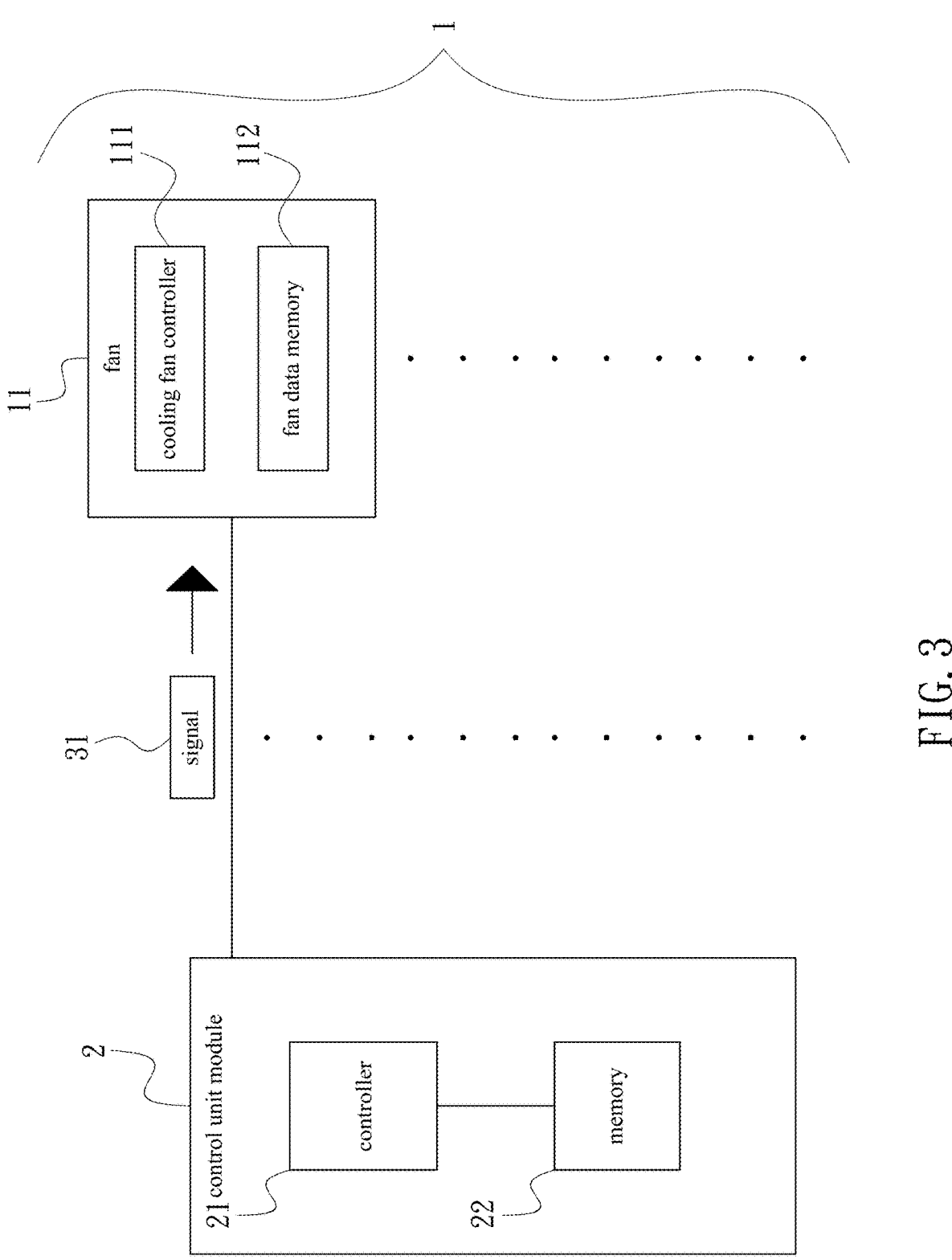
FIG. 3 is a block diagram showing the system framework and operation of the fan control system according to another embodiment of the present invention.

FIG. 3 is a block diagram showing the system framework and operation of the fan control system according to another embodiment of the present invention.

As shown in FIG. 3, the fan control system 1 includes more than one fan 11. Each of the fans 11 includes a cooling fan controller 111 and a fan data memory 112. Depending on practical implementation and requirement, the fan control system 1 can further include a control unit module 2 consisting of a controller 21 and a memory 22. However, for the fan control system 1 of the present invention, the control unit module 2 is not a prerequisite but a peripheral provided for cooperative operation with the fan control system 1.

When the fans 11 of the fan control system 1 start operating according to a default value, the cooling fan controllers 111 detect whether there are signals 31 of two or more PWM signals being input, such as signal PWM1, PWM2 or PWM3, or signals PWM1 and PWM3. Here, the signals 31 may be in an interval of PWM1~PWM2 of a first section, and/or in an interval of PWM3~PWM4 of a second section, and/or in an interval of PWM1 and PWM3 of a third section, and/or in the interval of PWM1~PWM2~PWM3 of a fourth section. The cooling fan controllers 111 may set one or more sections of RPM intervals for the purpose of RPM spread spectrum (SS). For example, the first section is the interval of PWM1~PWM2, and/or the second section is the interval of PWM3~PWM4, and/or the third section is the interval of PWM1 and PWM3, and/or the fourth section is the interval of PWM1~PWM2~PWM3. The cooling fan controllers may also set a rotational speed difference (ΔRPM) for SS, the number of spread spectrums, or the time at which the rotational speed changes. If it is detected there is not any signal 31 of the PWM signals being input, the fans 11 including the cooling fan controllers 111 keep operating according to the default value. If there is any signal 31 of the PWM signals being input, the cooling fan controllers 111 further detect whether there is any change in the two or more PWM signals 31 input to the fan control system. If not, the fans 11 including the cooling fan controllers 111 keep operating according to presently set values. If yes, the cooling fan controllers 111 shall follow a system PWM value computed and derived by the fan control system 1 to set internal PWM values for the fans 11 to cycle within corresponding intervals.

The cooling fan controllers 111 compute on the two or more input PWM signals 31 to derive an optimal system PWM value and set internal PWM values for the fans 11 to cycle within the corresponding intervals. In addition to the calculation of the optimal system PWM value based on the input two or more PWM signals 31, the cooling fan controllers 111 also compute the values of revolutions per minute (RPM), to which the input two or more PWM signals correspond. The cooling fan controllers 111 may set one or more sections of RPM intervals for the purpose of spread spectrum (SS) of rotational speed (RPM). For example, the first section is the interval of PWM1~PWM2, and/or the second section is the interval of PWM3~PWM4, and/or the third section is the interval of PWM1 and PWM3, and/or the fourth section is the interval of PWM1~PWM2~PWM3. The cooling fan controllers 111 may also set a rotational speed difference ΔRPM for SS, the number of SS, and the time at which the rotational speed changes. For instance, in the first section, the PWM1 may change from a duty ratio of 30% and a RPM difference ΔRPM of 2% to the PWM2 of a duty ratio of 25% and a RPM difference ΔRPM of 2%; and in the second section, the PWM3 may change from a duty ratio of 70% and a RPM difference ΔRPM of 2% to the PWM4 of a duty ratio of 75%. Here, since there are first and second sections, the number of SS is two (2), and the duration (time) of the first and/or the second section can be one (1) second.

In the above embodiment, in the first section, the PWM1 can change from a duty ratio of 30% and a ΔRPM of 2% to the PWM2 of a duty ratio of 25% and a ΔRPM of 2%, and in the second section, the PWM3 can change from a duty ratio of 70% and a ΔRPM of 2% to the PWM4 of a duty ratio of 75%; and there are the first section and the second section, the number of SS is two (2); and the total duration (time) of the first section plus the second section is one (1) second. However, in practical implementation of the present invention, the duty ratios of the signals 31 PWM1, PWM2, PWM3, and PWM4; and/or the percentage of the ΔRPM; and/or the duty ratios or RPM intervals in the one or more sections (such as the first section and/or the second section and/or the third section and/or the fourth section), and/or the time intervals of the PWM1, PWM2, PWM3 and PWM4 signals 31 from 0.3 seconds to 10 seconds all are adjustable and not restricted to what described in the above embodiment.

The fan data memory 112 can be used to store temporarily/store the signals 31 of the two or more PWM signals and/or system PWM value, and/or more than two RPM values, and/or the ΔRPM, and/or the RPM SS, and/or the number of SS, and/or the time at which RPM changes.

The fan data memory can be at least one of a flash RAM, a hard disk drive (HDD), a solid state disk (SSD), a USB flash drive, and other units allowing for data access.

The fan control system 1 with a control unit module 2 is applied to an electronic apparatus, such as a computer, a server, a supercomputer, an artificial intelligence (AI) server, a communication chassis, or other electronic devices. The control unit module 2 includes a controller 21 and a memory 22. The controller 21 may be, but not limited to, a microcontroller (MCU). The controller 21 has more than one output pin and a main power pin for receiving an input voltage $V_c$ (such as 12V or 10V). The output pins are correspondingly electrically connected to the fans 11 of the fan control system 1 and are indicated as PWM signal output pins for outputting PWM signals (i.e. output signals) to the corresponding fans 11 of the fan control system 1.

In other words, the output pins of the controller 21 can output the signals 31 of the two or more PWM signals to the corresponding fans 11 of the fan control system 1.

In practical implementation of the present invention, in addition to the output pins, the controller 21 further includes other pins for controlling other functions.

The controller 21 may be a processor or a digital signal processor. The above mentioned output pins are voltage output pins or serial data output pins, or other specific pins, such as I/O pins, for outputting signals (such as voltage signals or serial data signals) to control and start corresponding fans, and/or PWM signals (i.e. output signals) to the fan control system 1.

The memory 22 can be a random access memory (RAM), a flash RAM, a hard disk drive (HDD), a solid state disk (SSD), or a USB flash drive, or other units allowing for data access. The memory 22 is electrically connected to the controller 21 and is used to store starting values/starting data, such as input voltage 12V or 10V, of the fans 11 of the fan control system 1.

Figure 4:
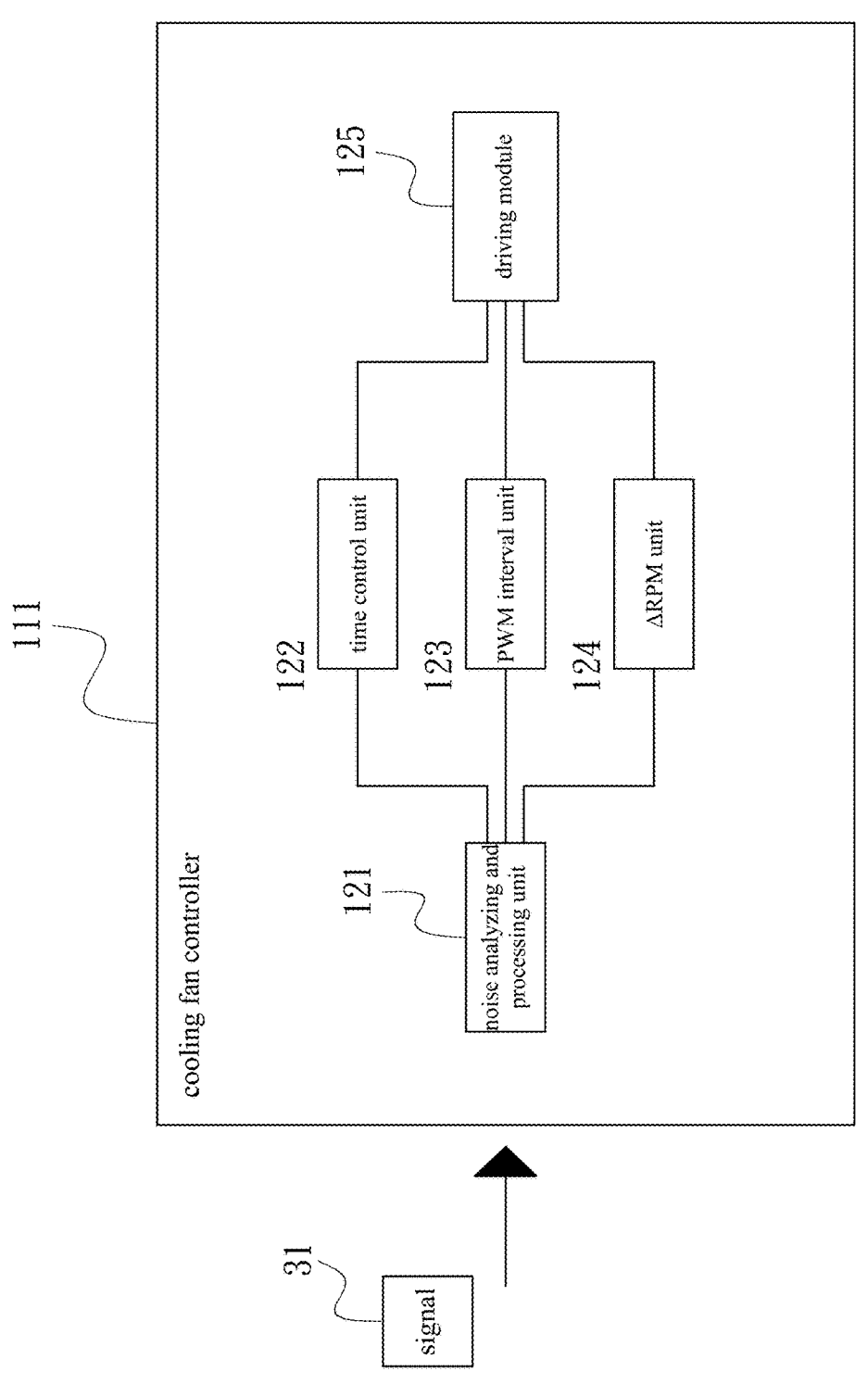
FIG. 4 is a block diagram showing the framework and operation of a cooling fan controller for the fan control system of FIG. 3.

FIG. 4 is a block diagram showing the framework and operation of the cooling fan controller 111 for the fan 11 of the fan control system 1 of FIG. 3.

As shown in FIG. 4, the cooling fan controller 111 includes a noise analyzing and processing unit 121, a time control unit 122, a PWM interval unit 123, a RPM difference ΔRPM unit 124, and a driving module 125. Output ends of the noise analyzing and processing unit 121 are electrically connected to input ends of the time control unit 122, the PWM interval unit 123, and the RPM difference ΔRPM unit 124; and output ends of the time control unit 122, the PWM interval unit 123, and the RPM difference ΔRPM unit 124 are electrically connected to an input end of the driving module 125. When each of the fans 11 starts operating, a signal 31 is transmitted via a fan transistor to the noise analyzing and processing unit 121 to verify whether the fan 11 requires special noise processing for the time being. If yes, the noise analyzing and processing unit 121 works with the cooperation of the time control unit 122, the PWM interval unit 123, and the RPM difference ΔRPM unit 124. For example, a duration time from zero to N seconds can be selected and set with the time control unit 122, and a PWM interval can be set with the PWM interval unit 123. For example, it can be set that the noise needs SS control only in the interval of PWM1~PWM2 of the first section or the SS is needed in more intervals, such as in the first section and/or the second section and/or the third section and/or the fourth section. And, a suitable ΔRPM between 0 to 100%, such as a ΔRPM of 2%, can be set with the RPM difference ΔRPM unit 124. After the above settings are finished, an electrical circuit of the driving module 125 will follow the settings to output a related signal to control a motor module and thereby achieve the purpose of fan noise reduction.

Figure 5:
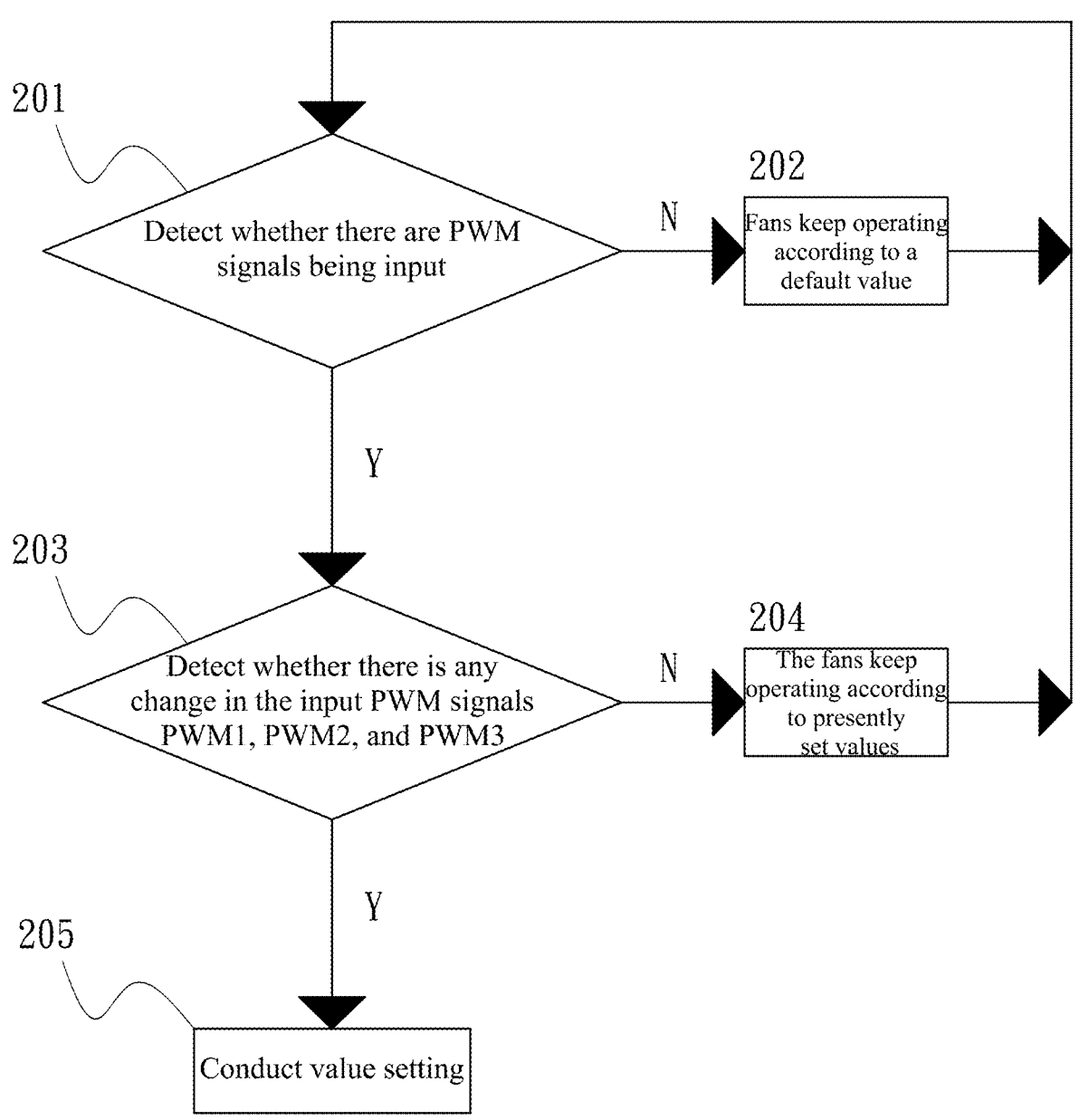
FIG. 5 is a flowchart showing the steps included in a fan control method according to a second embodiment of the present invention for implementing the fan control system of FIG. 3.

FIG. 5 is a flowchart showing the steps included in a fan control method according to a second embodiment of the present invention for implementing the fan control system 1 of FIG. 3.

As shown in FIG. 5, in a first step 201 of the fan control method of the present invention, detection is conducted when the fans 11 of the fan control system 1 start operating according to a default value. The cooling fan controllers 111 of the fans 11 detect the fan control system 1 to verify whether there are signals 31 of two or more PWM signals PWM1, PWM2 and PWM3 being input. Here, the signals 31 may be in the interval between PWM1 and PWM3 of the third section, and/or in the interval PWM1~PWM2~PWM3 of the fourth section. The cooling fan controllers 111 may set one or more sections of RPM interval for the purpose of RPM SS. For example, the first section is the interval PWM1~PWM2, and/or the second section is the interval PWM3~PWM4, and/or the third section is the interval between PWM1 and PWM3 of, and/or the fourth section is the interval among PWM1~PWM2~PWM3. The cooling fan controllers may also set the ΔRPM for SS, the number of SS, and the time at which the RPM changes. If there is not any signal 31 of PWM signals being input, the fan control method goes to a second step 202; or if there are signals 31 of two or more PWM signals being input to the fan control system 1, the fan control method goes to a third step 203.

In the second step 202, the fans 11 of the fan control system 1 including the cooling fan controllers 111 keep operating according to the default value, and the fan control method goes back to the first step 201.

In the third step 203, the detection of PWM signals is conducted. The cooling fan controllers 111 of the fans 11 detect whether there is any change in the signals 31 of the two or more PWM signals PWM1, PWM2 and/or PWM3 input to the fan control system 1. Here, the signals 31 may be in the interval PWM1~PWM2 of the first section, and/or in the interval PWM3~PWM4 of the second section, and/or in the interval PWM1 and PWM3 of the third section, and/or in the interval PWM1~PWM2~PWM3 of the fourth section. The cooling fan controllers 111 may set one or more sections of RPM intervals for RPM SS. For example, the first section is the interval of PWM1~PWM2, and/or the second section is the interval of PWM3~PWM4, and/or the third section is the interval of PWM1 and PWM3, and/or the fourth section is the interval of PWM1~PWM2~PWM3. The cooling fan controllers 111 may also set the ΔRPM for SS, the number of SS, and the time at which the RPM changes. If there is not any change in the signals 31 of the PWM signals, the fan control method goes to a fourth step 204; or if there is any change in the signals 31 of two or more signals PWM1, PWM2 and PWM3 input to the fan control system 1, the fan control method goes to a fifth step 205.

In the fourth step 204, the fans 11 of the fan control system 1 keep operating according to the presently set values and the fan control method goes back to the first step 201.

On the other hand, in the fifth step 205, value setting is conducted. The fan control system 1 computes and derives a system PWM value, based on which the cooling fan controllers 111 set internal PWM values for the fans 11 to cycle within corresponding intervals.

Here, the cooling fan controllers 111 calculate on signals 31 of the input two or more PWM signals to derive an optimal system PWM value for setting the internal PWM values of the fans 11 to cycle in the corresponding intervals.

In addition to the calculation of the optimal system PWM value based on the signals 31 of the input two or more PWM signals PWM1, PWM2, and/or PWM3, the cooling fan controllers 111 also compute the values of revolutions per minute (RPM), such as RPM1 and/or RPM2 and/or RPM3 and/or RPM4, to which each of the two or more input PWM signals correspond. The cooling fan controllers 111 may also set one or more sections of RPM intervals for the purpose of spread spectrum (SS). For example, the first section is the interval PWM1~PWM2, and/or the second section is the interval of PWM3~PWM4, and/or the third section is the interval of PWM1 and PWM3, and/or the fourth section is the interval PWM1~PWM2~PWM3. The cooling fan controllers 111 may also set the ΔRPM for SS, the number of SS, and the time at which the rotational speed changes.

Figure 6:
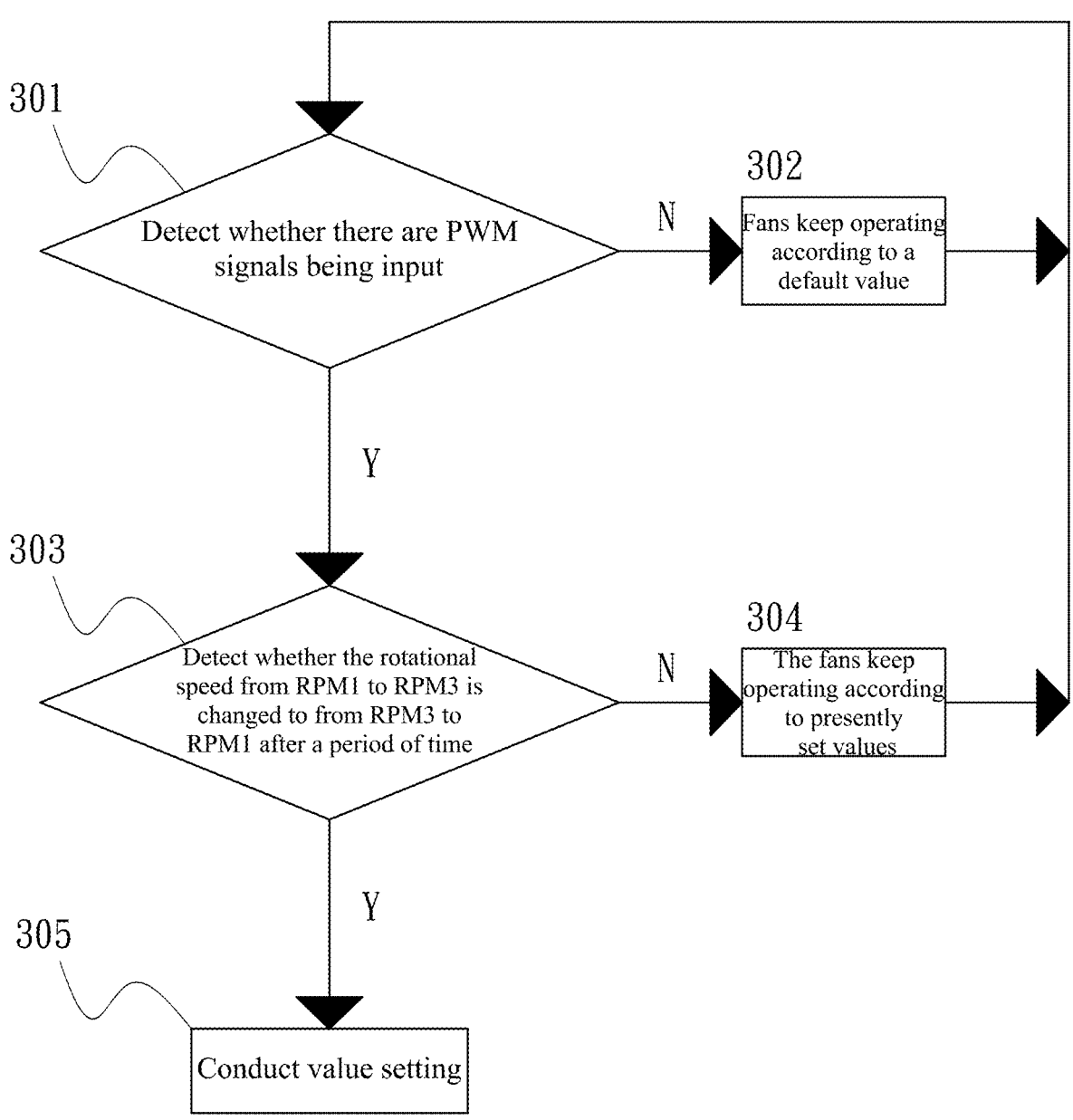
FIG. 6 is another flowchart showing the steps included in a fan control method according to a third embodiment of the present invention for implementing the fan control system of FIG. 3.

FIG. 6 is another flowchart showing the steps included a fan control method according to a third embodiment of the present invention for implementing the fan control system of FIG. 3.

As shown in FIG. 6, in a first step 301 of the fan control method of the present invention, detection is conducted when the fans 11 of the fan control system 1 start operating according to a default value. The cooling fan controllers 111 of the fans 11 detect the fan control system 1 to verify whether there are signals 31 of two or more PWM signals being input. Here, the signals 31 may be in the interval PWM1~PWM2 of the first section, and/or in the interval PWM3~PWM4 of the second section. The cooling fan controllers 111 may set one or more sections of RPM intervals for the purpose of RPM SS, such as SS for the interval PWM1~PWM2 of the first section, and/or the interval PWM3~PWM4 of the second section, and/or the interval between PWM1 and PWM3 of the third section, and/or the interval of PWM1~PWM2~PWM3 of the fourth section. Or, the cooling fan controllers 111 may also set the ΔRPM for SS, the number of SS, and the time at which the RPM changes. If there is not any signal 31 of PWM signal being input, the fan control method goes to a second step 302; or if there are signals 31 of two or more PWM signals being input to the fan control system 1, the fan control method goes to a third step 303.

In the second step 302, the fans 11 of the fan control system 1 including the cooling fan controllers 111 keep operating according to the default value, and the fan control method goes back to the first step 301.

In the third step 303, the detection of PWM signals is conducted. The cooling fan controllers 111 of the fans 11 detect whether there is any change in the signals 31 of two or more PWM signals PWM1, PWM2 and/or PWM3 input to the fan control system 1. Here, the signals 31 may be in the interval PWM1~PWM2 of the first section, and/or in the interval PWM3~PWM 4 of the second section, and/or in the interval of PWM1 and PWM3 of the third section, and/or in the interval PWM1~PWM2~PWM3 of the fourth section. The cooling fan controllers 111 may set one or more sections of RPM intervals for the purpose of SS, such as SS of the interval PWM1~PWM2 of the first section, and/or the interval PWM3~PWM4 of the second section, and/or the interval between PWM1 and PWM3 of the third section, and/or the interval PWM1~PWM2~PWM3 of the fourth section. The cooling fan controllers 111 may also set the ΔRPM for SS, the number of SS, and the time at which the RPM changes. If there is not any change in the signals 31 of the PWM signals, the fan control method goes to a fourth step 304; or if there is any change in the signals 31 of the two or more PWM signals input to the fan control system 1, the fan control method goes to a fifth step 305. In other words, for example, in the third section, if the rotational speed from RPM1 to RPM3 is changed to from RPM3 to RPM1 after a period of time, the fan control method goes to the third step 305.

In the fourth step 304, the fans 11 of the fan control system 1 keep operating according to presently set values and the fan control method goes back to the first step 301.

On the other hand, in the fifth step 305, value setting is conducted. The fan control system 1 computes and derives a system PWM value, based on which the cooling fan controllers 111 set internal PWM values for the fans 11 to cycle within corresponding intervals.

Here, the cooling fan controllers 111 calculate on the signals 31 of the input two or more PWM signals to derive the optimal system PWM value, based on which the cooling fan controllers 111 set the internal PWM values for the fans 11 to cycle within corresponding intervals. In addition to the calculation of the optimal system PWM value based on the signals 31 of the input two or more PWM signals, the cooling fan controllers 111 also compute values of revolutions per minute (RPM), such as RPM1, RPM2, RPM3, and RPM4, to which the two or more input PWM signals correspond. The cooling fan controllers 111 may also set one or more sections of RPM intervals for the purpose of RPM spread spectrum. For example, the first section is the interval PWM1~PWM2, and/or the second section is the interval PWM3~PWM4, and/or the third section is the interval between PWM1 and PWM3, and/or the fourth section is the interval among PWM1~PWM2~PWM3. The cooling fan controllers 111 may also set the ΔRPM for SS, the number of SS, or the time at which the rotational speed changes.

Figure 7:
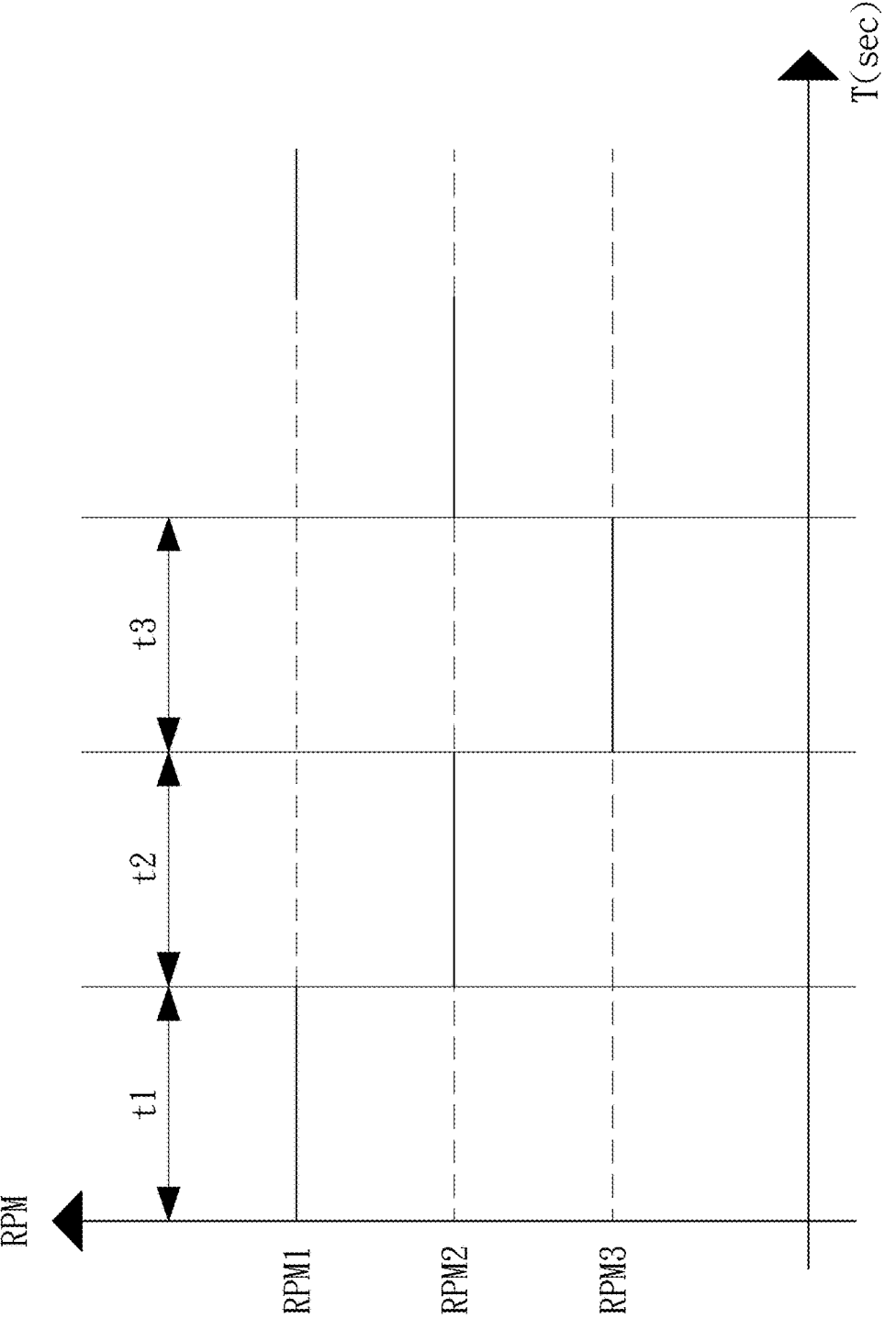
FIG. 7 is a graph showing the correlation of RPM1, RPM2, and RPM3 with time in the embodiment of FIG. 5.

FIG. 7 is a graph showing the correlation of RPM1, RPM2, and RPM3 with time in the embodiment of FIG. 5.

As shown in FIG. 7, the RPM in the time interval t1 has a value of RPM1, the RPM in the time interval t2 has a value of RPM2, and the RPM in the time interval t3 has a value of RPM3.

In the time interval t1, the RPM value is RPM1. After a fixed time t1, the RPM value is changed from RPM1 to RPM2. After another fixed time t2, the RPM value is changed from RPM2 to RPM3. An average RPM can be calculated using the formula of (RPM1+RPM2+RPM3)/3 to obtain a target RPM value. Suppose the target RPM is RPM2, then RPM1=RPM2+ΔRPM, RPM3=RPM2−ΔRPM, and it is derived the average RPM is RPM2.

Figure 8:
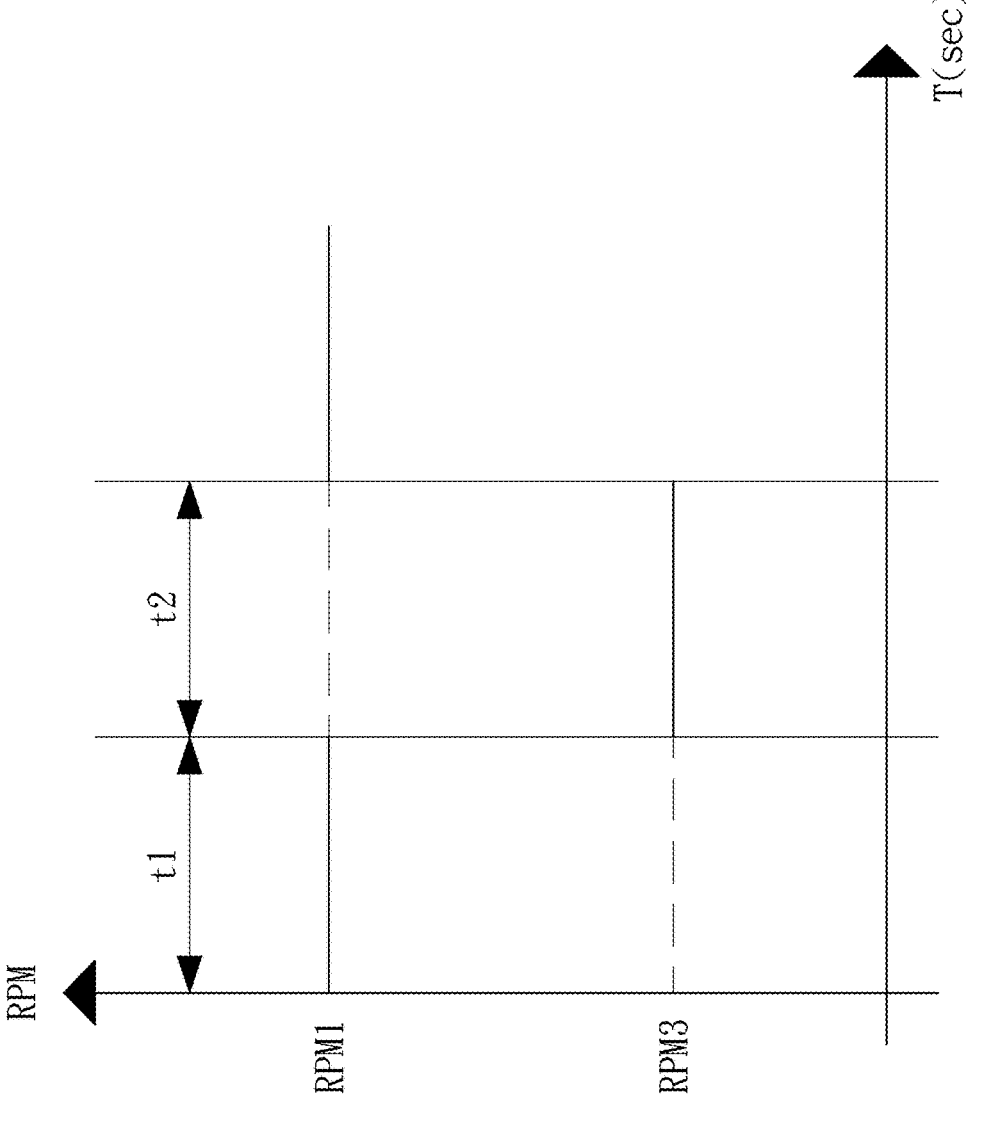
FIG. 8 is a graph showing the correlation of RPM1 and RPM3 with time in the embodiment of FIG. 5.

FIG. 8 is a graph showing the correlation of RPM1 and RPM3 with time in the embodiment of FIG. 5.

As shown in FIG. 8, the RPM in the time interval t1 has a value of RPM1. After a fixed time t1, the RPM value is changed from RPM1 to RPM3. The RPM in the time interval t2 has a value of RPM3. After another fixed time t2, the RPM value is changed from RPM3 to RPM1 again.

When the RPM is changed from RPM1 to RPM3 after a period of time, the average RPM=(RPM1+RPM3)/2, and a target RPM value can be obtained by calculation. Suppose that the target RPM is $RPM_{target}$, then RPM1=$RPM_{target}$+ΔRPM, and RPM3=$RPM_{target}$−ΔRPM, and it is derived the average RPM is $RPM_{target}$.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A fan control method applied to cooling fans working in a computer system, the method comprising the following steps:

conducting detection: upon start of operation at a default value, detecting a fan control system to verify whether two or more PWM signals are being input; if two or more PWM signals are not being input, fans of the fan control system operate according to the default value;

detecting PWM signals: if two or more PWM signals are being input, detecting whether there is any change in the two or more PWM signals input to the fan control system; if any change in the two or more PWM signals is not detected, the fans of the fan control system keeping operating according to presently set values; and conducting value setting: if any change in the two or more PWM signals is detected, the fan control system computes a system PWM value, based on which internal PWM values for the fans are set for cycling within corresponding intervals to reduce resonance energy concentration and amplitude and corresponding noise.

2. The fan control method as claimed in claim 1, wherein the fans of the fan control system start operating according to a default value before the detection is conducted.

3. The fan control method as claimed in claim 2, wherein one or more sections of rotational speed (revolutions-per-minute, RPM) intervals are set in the step of conducting value setting.

4. The fan control method as claimed in claim 3, wherein one or more sections of rotational speed (revolutions-per-minute, RPM) intervals, differences in RPM (ΔRPM) for the purpose of spread spectrum (SS), number of SS, and a time at which the RPM changes can be set in the step of conducting value setting.

5. The fan control method as claimed in claim 1, wherein one or more sections of rotational speed (revolutions-per-minute, RPM) intervals are set in the step of conducting value setting.

6. The fan control method as claimed in claim 5, wherein one or more sections of rotational speed (revolutions-per-minute, RPM) intervals, differences in RPM (ΔRPM) for the purpose of spread spectrum (SS), number of SS, and a time at which the RPM changes can be set in the step of conducting value setting.

7. The fan control method as claimed in claim 1, wherein the fan control system is applicable to at least one of a computer, a server, a supercomputer, an artificial intelligence (AI) server, and a communication chassis.

8. A fan control system applied to cooling fans working in a computer case each fan respectively including a cooling fan controller and a fan data memory working with the cooperation of the cooling fan controller, wherein, upon start of operation at a default value, each cooling fan controller detects whether two or more PWM signals input are being input to the fan control system; if two or more PWM signals are not being input, the fans of the fan control system operate according to the default value; or if two or more PWM signals are being input, the cooling fan controllers further detect whether there is any change in the two or more PWM signals input to the fan control system; if any change in the two or more PWM signals is not detected, the fans of the fan control system keeping operating according to presently set values; or if any change in the two or more PWM signals is detected, the cooling fan controllers, based on a system PWM value computed by the fan control system, sets internal PWM values of the fans for cycling within corresponding intervals to reduce resonance energy concentration and amplitude and corresponding noise; and the fan data memory storing the two or more PWM signals and/or the internal PWM values of the fans.

9. The fan control system as claimed in claim 8, wherein the fans of the fan control system start operating according to a default value before the cooling fan controllers detect whether there are two or more PWM signals being input to the fan control system.

10. The fan control system as claimed in claim 9, wherein the cooling fan controllers further set one or more sections of rotational speed (revolutions-per-minute, RPM) intervals.

11. The fan control system as claimed in claim 10, wherein, in addition to the setting of one or more sections of rotational speed (revolutions-per-minute, RPM) intervals, the cooling fan controllers can also set differences in RPM (ΔRPM) for the purpose of spread spectrum (SS), number of SS, and a time at which the RPM changes; and the fan data memories being usable to store temporarily/store the one or more sections of RPM intervals, the differences in RPM (ΔRPM) for spread spectrum (SS), the number of SS, and the time at which the RPM changes set by the cooling fan controllers.

12. The fan control system as claimed in claim 8, wherein the cooling fan controllers further set one or more sections of rotational speed (revolutions-per-minute, RPM) intervals.

13. The fan control system as claimed in claim 12, wherein, in addition to the setting of one or more sections of rotational speed (revolutions-per-minute, RPM) intervals, the cooling fan controllers can also set differences in RPM (ΔRPM) for the purpose of spread spectrum (SS), number of SS, and a time at which the RPM changes; and the fan data memories being usable to store temporarily/store the one or more sections of RPM intervals, the differences in RPM (ΔRPM) for spread spectrum (SS), the number of SS, and the time at which the RPM changes set by the cooling fan controllers.

14. The fan control system as claimed in claim 8, wherein the fan control system is applicable to at least one of a computer, a server, a supercomputer, an artificial intelligence (AI) server, and a communication chassis.

* * * * *